(12) United States Patent
Choi et al.

(10) Patent No.: US 12,313,693 B2
(45) Date of Patent: May 27, 2025

(54) BATTERY DIAGNOSING APPARATUS, BATTERY INSPECTION SYSTEM AND BATTERY DIAGNOSING METHOD

(71) Applicant: LG Energy Solution, Ltd., Seoul (KR)

(72) Inventors: Soon-Ju Choi, Daejeon (KR);
Seo-Young Yoon, Daejeon (KR);
Dae-Soo Kim, Daejeon (KR);
Young-Deok Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 18/715,255

(22) PCT Filed: Aug. 30, 2023

(86) PCT No.: PCT/KR2023/012916
§ 371 (c)(1),
(2) Date: May 31, 2024

(87) PCT Pub. No.: WO2024/049211
PCT Pub. Date: Mar. 7, 2024

(65) Prior Publication Data
US 2025/0110183 A1    Apr. 3, 2025

(30) Foreign Application Priority Data

Sep. 2, 2022 (KR) .......................... 10-2022-0111697
Aug. 8, 2023 (KR) .......................... 10-2023-0103524

(51) Int. Cl.
*G01R 31/392* (2019.01)
*G01R 31/374* (2019.01)
(Continued)

(52) U.S. Cl.
CPC ......... *G01R 31/392* (2019.01); *G01R 31/374* (2019.01); *G01R 31/3842* (2019.01); *G01R 31/389* (2019.01)

(58) Field of Classification Search
None
See application file for complete search history.

(56) References Cited

U.S. PATENT DOCUMENTS

2010/0090660 A1* 4/2010 Eger .................. G01R 31/3835
                                                    320/153
2018/0040928 A1* 2/2018 Yu ....................... H01M 10/443
(Continued)

FOREIGN PATENT DOCUMENTS

JP      H11-285155 A      10/1999
JP      2007-166789 A     6/2007
(Continued)

OTHER PUBLICATIONS

International Search Report for Application No. PCT/KR2023/012916 mailed Dec. 18, 2023. 3 pgs.
(Continued)

*Primary Examiner* — Jas A Sanghera
(74) *Attorney, Agent, or Firm* — Lerner David LLP

(57) ABSTRACT

A battery diagnosing apparatus includes a battery sensing unit configured to generate a voltage detection signal indicating voltage of a target battery and a current detection signal indicating current of the target battery. The battery diagnosing apparatus also includes a battery diagnosing unit configured to generate a measurement voltage profile representing the correspondence between an accumulated capacity and the voltage of the target battery in a period of interest by monitoring the voltage and current of the target battery while the target battery is being charged or discharged and diagnose abnormality of the target battery by comparing the measurement voltage profile with a criterion voltage profile.

18 Claims, 9 Drawing Sheets

(51) Int. Cl.
    *G01R 31/3842*     (2019.01)
    *G01R 31/389*     (2019.01)

(56)                 References Cited

U.S. PATENT DOCUMENTS

| | | |
|---|---|---|
| 2018/0259584 A1* | 9/2018 | Yan .................... G01R 31/3842 |
| 2018/0299511 A1 | 10/2018 | Kim |
| 2023/0093809 A1* | 3/2023 | Yoshitake ............ G01R 31/392 |
| | | 320/132 |
| 2023/0176130 A1 | 6/2023 | Kim |
| 2023/0273264 A1 | 8/2023 | Kim |

FOREIGN PATENT DOCUMENTS

| | | |
|---|---|---|
| JP | 6180249 B2 | 8/2017 |
| JP | 6880806 B2 | 6/2021 |
| JP | 2021-110579 A | 8/2021 |
| KR | 20180116914 A | 10/2018 |
| KR | 2021-0030089 A | 3/2021 |
| KR | 2022-0021276 A | 2/2022 |
| KR | 102372874 B1 | 3/2022 |
| KR | 2022-0094464 A | 7/2022 |
| KR | 2022-0099727 A | 7/2022 |

OTHER PUBLICATIONS

Written Opinion for Application No. PCT/KR2023/012916 mailed Dec. 18, 2023. 3 pgs.

* cited by examiner

BATTERY DIAGNOSING APPARATUS, BATTERY INSPECTION SYSTEM AND BATTERY DIAGNOSING METHOD

CROSS-REFERENCE TO RELATED APPLICATIONS

The present application is a national phase entry under 35 U.S.C. § 371 of International Application No. PCT/KR2023/012916 filed on Aug. 30, 2023, which claims priority to Korean Patent Application No. 10-2022-0111697 filed on Sep. 2, 2022 in the Republic of Korea and Korean Patent Application No. 10-2023-0103524 filed on Aug. 8, 2023 in the Republic of Korea, the disclosures of which are incorporated herein by reference.

TECHNICAL FIELD

The present disclosure relates to battery diagnosis, and more specifically, to a technology for diagnosing abnormality of a new manufactured battery.

BACKGROUND

Recently, the demand for portable electronic products such as notebook computers, video cameras, and portable telephones has increased sharply, and electric vehicles, energy storage batteries, robots, satellites, and the like have been developed in earnest. Accordingly, high-performance batteries allowing repeated charging and discharging are being actively studied.

Batteries commercially available at present include nickel-cadmium batteries, nickel-hydrogen batteries, nickel-zinc batteries, lithium batteries, and the like. Among them, the lithium batteries are in the limelight since they have almost no memory effect compared to nickel-based batteries and also have very low self-charging rate and high energy density.

Typically, batteries are manufactured and then go through an activation process and defect inspection process before being finally shipped.

In the activation process, the battery is charged and discharged at least once according to a predetermined schedule. As the activation process progresses, the SEI is formed on the surface of the negative electrode, and the performance of the battery is revealed. The SOC (State Of Charge) of the battery that has completed the activation process is approximately 60%.

In the conventional defect inspection process, the full charge stage and the full discharge stage for the battery proceed sequentially. Here, in the full charge stage, the battery is charged until the voltage of the battery reaches the charging end voltage or the SOC of the battery reaches 100%. In the full discharge stage, the battery is discharged until the voltage of the battery reaches the discharging end voltage or the SOC of the battery reaches 0%. The same constant current or different constant currents may be used in the full charge stage and the full discharge stage.

The full charge capacity (FCC) of the battery may be confirmed by applying ampere counting to the discharging current measured according to a predetermined sampling rate from the completion time of the full charge stage to the completion time of the full discharge stage.

If the full charge capacity of the battery confirmed in the defect inspection process is within a predetermined target capacity range, it means that the full charge capacity is normal, and the battery is classified as a good product and shipped through the shipping charging stage. In the shipping charging stage, the SOC of a fully discharged battery is charged to approximately 30%. On the other hand, if the full charge capacity of the battery is outside the target capacity range, the battery is classified as a defective product and discarded.

SUMMARY

Technical Problem

However, since the full charge stage, the full discharge stage and the shipping charge process of the above-described conventional defect inspection process are each performed at a low current rate (e.g., 0.1 C), there is a disadvantage of requiring a long time of about 10 hours to check for abnormalities of a new battery.

The present disclosure is designed to solve the problems of the related art, and therefore the present disclosure is directed to providing a battery diagnosing apparatus, a battery inspection system and a battery diagnosing method, which may shorten the time required to inspect abnormality of a battery by omitting or simplifying at least one of the full charge stage, the full discharge stage and the shipping charge process of the conventional defect inspection process.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery diagnosing apparatus according to one aspect of the present disclosure comprises a battery sensing unit configured to generate a voltage detection signal indicating voltage of a target battery and a current detection signal indicating current of the target battery; and a battery diagnosing unit configured to generate a measurement voltage profile representing the correspondence between an accumulated capacity and the voltage of the target battery in a period of interest by monitoring the voltage and current of the target battery based on the voltage detection signal and the current detection signal collected from the battery sensing unit while the target battery is being charged or discharged. The period of interest is from a first time point when the voltage of the target battery reaches one of an upper limit and a lower limit of a predetermined voltage range of interest to a second time point when the voltage of the target battery reaches the other one of the upper limit and the lower limit of the voltage range of interest.

The battery diagnosing unit may be configured to diagnose abnormality of the target battery by comparing the measurement voltage profile with a criterion voltage profile. The criterion voltage profile may represent the correspondence between the accumulated capacity and voltage of a criterion battery that is verified to be normal in an available voltage range wider than the voltage range of interest.

The battery diagnosing unit may be configured to determine an integration value of current time series monitored over a period from the first time point to a specific time point within the period of interest as an accumulated capacity at the specific time point.

The battery sensing unit may be configured to generate a temperature detection signal indicating temperature of the target battery. The battery diagnosing unit may be configured to select, as the criterion voltage profile, at least one of a plurality of comparison voltage profiles that are one-to-one associated with a plurality of criterion temperature values, based on the temperature detection signal collected in the period of interest.

The battery diagnosing unit may be configured to determine a representative temperature value in the period of interest based on the temperature detection signal, and select a comparison voltage profile associated with any one of the plurality of criterion temperature values with a minimum temperature difference from the representative temperature value as the criterion voltage profile.

The battery diagnosing unit may be configured to determine a representative temperature value in the period of interest based on the temperature detection signal, and select an average of two comparison voltage profiles associated with two criterion temperature values among the plurality of criterion temperature values as the criterion voltage profile. The two criterion temperature values may define a narrowest temperature range to which the representative temperature value belongs.

The battery diagnosing unit may be configured to generate an adjusted measurement voltage profile by adjusting the measurement voltage profile so that an error amount with the criterion voltage profile is minimized, generate main adjustment information indicating an adjustment level from the measurement voltage profile to the adjusted measurement voltage profile, and determine abnormality of at least one of a full charge capacity and an internal resistance of the target battery based on the main adjustment information.

The battery diagnosing unit may be configured to determine the sum of squares or the root mean square error of a voltage difference between the adjusted measurement voltage profile and the criterion voltage profile in a common capacity range of the adjusted measurement voltage profile and the criterion voltage profile as the error amount between the adjusted measurement voltage profile and the criterion voltage profile.

The battery diagnosing unit may be configured to generate the adjusted measurement voltage profile by applying each of first to fourth adjustment logics to the measurement voltage profile. The first adjustment logic is a capacity scaling logic that reduces or expands the measurement voltage profile along a first axis corresponding to the accumulated capacity. The second adjustment logic is a capacity shifting logic that moves the measurement voltage profile in parallel along the first axis. The third adjustment logic is a voltage scaling logic that reduces or expands the measurement voltage profile along a second axis corresponding to the voltage. The fourth adjustment logic is a voltage shifting logic that moves the measurement voltage profile in parallel along the second axis. The main adjustment information includes first to fourth adjustment result values that are one-to-one related to the first to fourth adjustment logics.

The battery diagnosing unit may be configured to determine abnormality of the full charge capacity of the target battery by comparing the first adjustment result value of the main adjustment information with a first diagnosis range.

The battery diagnosing unit may be configured to determine an estimated full charge capacity of the target battery by applying the first adjustment result value of the main adjustment information to a criterion full charge capacity associated with the criterion voltage profile.

The battery diagnosing unit may be configured to determine abnormality of the internal resistance of the target battery by comparing the fourth adjustment result value of the main adjustment information with a second diagnosis range.

The battery diagnosing unit may be configured to determine an estimated internal resistance of the target battery by applying the fourth adjustment result value of the main adjustment information to a criterion internal resistance associated with the criterion voltage profile.

A battery inspection system according to another aspect of the present disclosure comprises the battery diagnosing apparatus.

A battery diagnosing method according to another aspect of the present disclosure comprises collecting a voltage detection signal and a current detection signal indicating voltage and current of a target battery while the target battery is being charged or discharged; generating a measurement voltage profile representing the correspondence between an accumulated capacity and the voltage of the target battery in a period of interest from a first time point when the voltage of the target battery reaches one of an upper limit and a lower limit of a predetermined voltage range of interest to a second time point when the voltage of the target battery reaches the other one of the upper limit and the lower limit of the voltage range of interest by monitoring the voltage and current of the target battery based on the voltage detection signal and the current detection signal; and diagnosing abnormality of the target battery by comparing the measurement voltage profile with a criterion voltage profile. The criterion voltage profile represents the correspondence between the accumulated capacity and voltage of a criterion battery that is verified to be normal in an available voltage range wider than the voltage range of interest.

The step of diagnosing abnormality of the target battery may include generating an adjusted measurement voltage profile by adjusting the measurement voltage profile so that an error amount with the criterion voltage profile is minimized: generating main adjustment information indicating an adjustment level from the measurement voltage profile to the adjusted measurement voltage profile; and determining abnormality of at least one of a full charge capacity and an internal resistance of the target battery based on the main adjustment information.

Advantageous Effects

According to at least one of the embodiments of the present disclosure, at least one of the full charge stage, the full discharge stage, and the shipping charge process of the conventional defect inspection process may be omitted or simplified. Accordingly, there is an advantage that the time required to check for abnormalities in the battery is shortened.

In addition, according to at least one of the embodiments of the present disclosure, by analyzing the comparison results between the voltage profile of the battery and the criterion voltage profile as a previously secured reference, it is also possible to diagnose not only whether the full charge capacity of the battery is abnormal, but also whether the internal resistance is abnormal.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

The terms, including the ordinal number such as "first," "second," and the like, may be used to distinguish one element from another among various elements but are not intended to limit the elements by the terms.

Throughout the specification, when a portion is referred to as "comprising" or "including" any element, it means that the portion may include other elements further, without excluding other elements, unless specifically stated otherwise. Additionally, terms such as " . . . unit" described in the specification refer to a unit that processes at least one function or operation, and may be implemented as hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
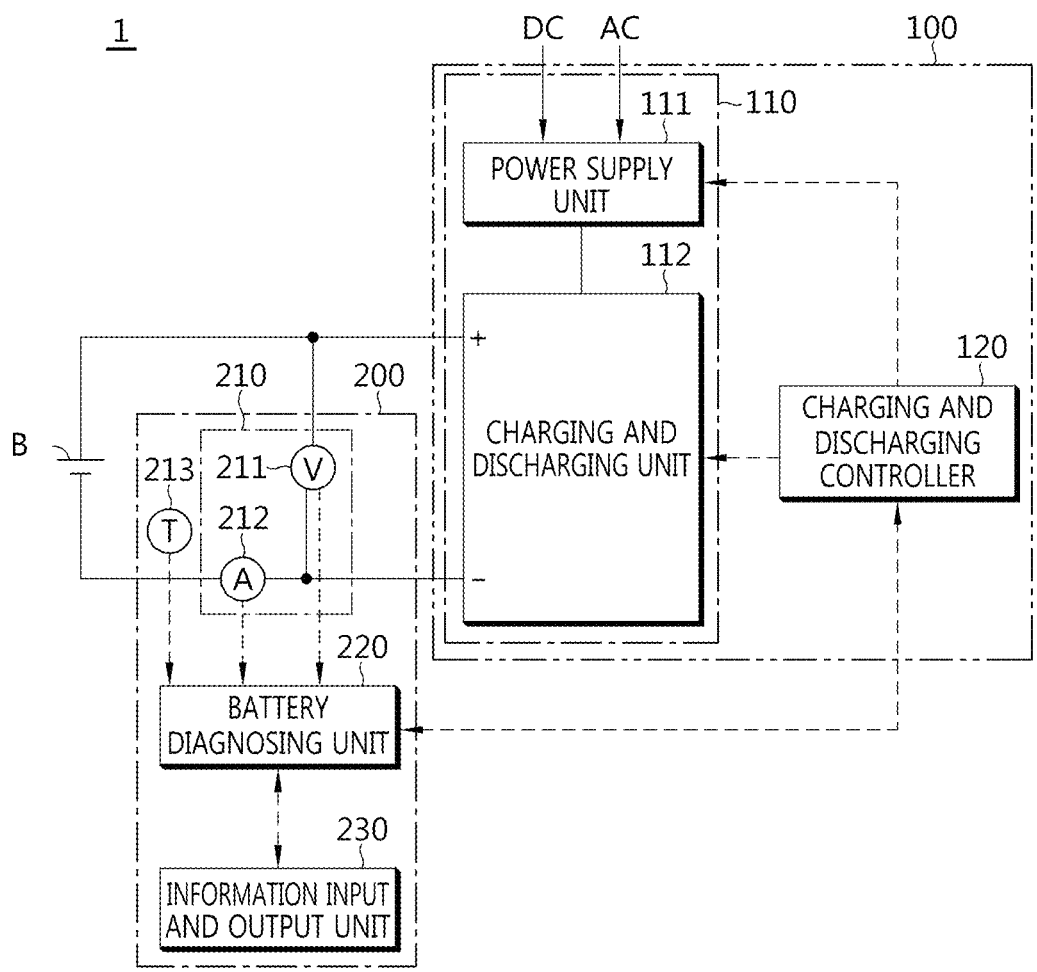
FIG. 1 is a diagram exemplarily showing the configuration of a battery inspection system including a battery diagnosing apparatus according to an embodiment of the present disclosure.

FIG. 1 is a diagram showing the configuration of a battery inspection system including a battery diagnosing apparatus according to an embodiment of the present disclosure.

Referring to FIG. 1, the battery inspection system 1 includes a charging and discharging equipment 100 and a battery diagnosing apparatus 200.

The charging and discharging equipment 100 is provided to charge or discharge the battery B according to a predetermined charging and discharging schedule so that the battery diagnosing apparatus 200 may obtain charging and discharging information necessary to diagnose defects in the battery (B, hereinafter referred to as 'target battery') that has undergone an activation process after completion of manufacturing.

The target battery B includes at least one battery cell that is in new condition (BOL: Beginning Of Life). The type of battery cell is not particularly limited as long as it can be repeatedly charged and discharged, such as a lithium-ion cell.

The charging and discharging equipment 100 has a charging function, a discharging function, and a resting function, and is configured to selectively execute one of the charging function, discharging, and resting functions according to the charging and discharging schedule and charge and discharge the target battery B based on control parameters (e.g. charging voltage, charging current, discharging voltage, discharging current, etc.) preset for each charging and discharging stage.

The charging and discharging equipment 100 includes a charging and discharging device 110 and a charging and discharging controller 120.

The charging and discharging device 110 includes a power supply unit 111 and a charging and discharging unit 112.

The power supply unit 111 is configured to convert power supplied from alternating current power and/or direct current power into direct current having a predetermined voltage level suitable for the input specifications of the charging and discharging unit 112. One or a combination of known AC-DC converters and DC-DC converters may be used as the power supply unit 111.

In the charging and discharging unit 112, a pair of charging and discharging terminals (+, −) provided therein may be connected to the positive electrode and negative electrode of the target battery B, respectively, to charge or discharge the target battery B according to a command from the charging and discharging controller 120. One or a combination of known constant current circuits and constant voltage circuits may be used as the charging and discharging unit 112.

The charging and discharging controller 120 remembers the charging and discharging schedule in advance in its internal memory. The charging and discharging controller 120 controls the charging and discharging device 110 so that the charging and discharging stages are sequentially performed according to the charging and discharging schedule in response to user input. Additionally, the charging and discharging controller 120 may notify the battery diagnosing apparatus 200 of progress information on the charging and discharging schedule.

The battery diagnosing apparatus 200 may control the charging and discharging equipment 100 so that the target battery B is charged and discharged according to any one of the first charging and discharging process and the second charging and discharging process.

While the charging and discharging equipment 100 charges and discharges the target battery B according to the first charging and discharging process or the second charging and discharging process, the battery diagnosing apparatus 200 periodically or aperiodically measures the voltage, current, and/or temperature of the target battery B, and record a set of battery parameters representing the measured value (sample value) of each of voltage, current and/or temperature. The battery parameter set may include at least one of voltage time series, current time series, and temperature time series.

According to the present disclosure, in order to diagnose whether the target battery B is defective, it is sufficient to secure only charging and discharging information of the target battery B for a narrower predetermined voltage range of interest instead of the predetermined available voltage range.

Here, the available voltage range is a voltage range where the charging end voltage and the discharging end voltage are the upper limit and the lower limit, respectively. In the conventional defect inspection process, there is a limitation that the entire available voltage range must be utilized to check the full charge capacity of the target battery B.

According to the present disclosure, the voltage range of interest used to check whether the target battery B is abnormal may be called a 'partial voltage range' in that it is narrower than the available voltage range.

Additionally, the charging and discharging information refers to either or both of data obtained during charging and data obtained during discharging.

Charging and discharging information collected while the voltage of the target battery B changes from one of the upper limit and the lower limit of the voltage range of interest to the other may be referred to as 'partial charging and discharging information'.

The battery diagnosing apparatus 200 is provided to diagnose whether the target battery B is defective based on a battery parameter set at the end of the first charging and discharging process or the second charging and discharging process.

The first charging and discharging process is a stage that discharges the target battery B with a discharging current of a predetermined current rate until the voltage of the target battery B reaches a predetermined target voltage, and may be referred to as the 'first shipping discharge stage'. The first charging and discharging process may be started immediately after the end of the activation process or at a time point when a predetermined rest time or more has elapsed from the end time point of the activation process. The target voltage is a predetermined voltage appropriate for battery shipment and is less than the activation end voltage and greater than the discharging end voltage. The target voltage may be an end condition of the conventional shipping discharge process described above. The activation end voltage is predetermined as the end condition of the activation process and is within the available voltage range.

According to this, the battery diagnosing apparatus 200 is capable of collecting charging and discharging information about the first voltage range of interest during the first charging and discharging process. The upper limit and the lower limit of the first voltage range of interest may be the activation end voltage and the target voltage, respectively.

The second charging and discharging process includes a full charge stage and a second shipping discharging stage. As described above, the full charge stage is a stage that charges the target battery B until the voltage of the target battery B that has gone through the activation process reaches the charging end voltage. The second shipping discharging stage is a stage that discharges the target battery B until the voltage of the target battery B reaches the target voltage. The shipping discharging stage may be started immediately after the end of the full charge stage or at a time point when a predetermined rest time has elapsed from the end time point of the full charge stage.

According to this, the battery diagnosing apparatus 200 is capable of collecting charging and discharging information about the second voltage range of interest during the second charging and discharging process. The upper and lower limits of the second voltage range of interest are the charging end voltage and the target voltage, respectively.

In each of the stages described above, the target battery B may be charged or discharged at the same or different current rates.

For example, it is assumed that the activation end voltage=3.4 V, the charging end voltage=4.2 V, the discharging end voltage=2.5 V, and the target voltage=3.0 V.

According to the conventional defect inspection process, the target battery B is charged from 3.4 V to 4.2 V by the full charge process and then discharged to 2.5 V by the full discharge stage. The full charge capacity of the target battery B is determined from the integration amount of the current time series acquired during the discharging period from 4.2 V to 2.5 V. After that, the target battery B is charged to 3.0 V and becomes ready for shipping.

In comparison, according to the first charging and discharging process in the present disclosure, the target battery B is discharged from 3.4 V to 3.0 V by the first shipping discharging stage, omitting the full charge stage. The full charge capacity of the target battery B is determined based on the voltage time series and the current time series acquired during the discharging period corresponding to the first voltage range of interest from 3.4 V to 3.0 V.

In addition, according to the second charging and discharging process in the present disclosure, the target battery B is charged from 3.4 V to 4.2 V in common with the full charge process of the conventional defect inspection process, but then is discharged to 3.0 V only by the second shipping discharging stage instead of the full charge discharging process. The full charge capacity of the target battery B is determined based on the voltage time series and the current time series acquired during the discharging period corresponding to the second voltage range of interest from 4.2 V to 3.0 V.

In other words, in either the first charging and discharging process or the second charging and discharging process, there are technical effects not only in that the time required to charge and discharge the target battery B is reduced compared to the conventional defect inspection process, but also in that the power consumption for charging and discharging the target battery B is reduced. Hereinafter, for convenience of explanation, the 'charging and discharging process' is a general term for the first charging and discharging process and the second charging and discharging process, and the 'voltage range of interest' is used a as a general term that refers to the first voltage range of interest and the second voltage range of interest.

The voltage time series, the current time series, and the temperature time series associated with the first charging and discharging process represent the history of changes in voltage, current, and temperature of the target battery B in the first voltage range of interest, respectively. The voltage time series, the current time series, and the temperature time series associated with the second charging and discharging process represent the change history of voltage, current, and temperature of the target battery B in the second voltage range of interest, respectively.

The battery diagnosing apparatus 200 includes a battery sensing unit 210 and a battery diagnosing unit 220. The battery diagnosing apparatus 200 may further include an information input and output unit 230. Hereinafter, it will be assumed that the battery diagnosing apparatus 200 includes all of the battery sensing unit 210, the battery diagnosing unit 220, and the information input and output unit 230.

The battery diagnosing unit 220 is operably coupled to the battery sensing unit 210, the information input and output unit 230, and the charging and discharging equipment 100. Two components operably coupled to each other mean that the two components are directly or indirectly connected to enable transmission and reception of signals in one direction or both directions.

The battery sensing unit 210 is configured to collect sample values (measured values) of battery parameters (voltage, current and/or temperature) periodically or aperiodically at certain times while the charging and discharging process for the target battery B is in progress.

The battery sensing unit 210 includes a voltage sensor 211 and a current sensor 212. The battery sensing unit 210 may further include a temperature sensor 213.

The voltage sensor 211 is connected to the positive electrode and the negative electrode of the target battery B through a pair of voltage sensing lines, and detects the voltage across both ends of the target battery B (can be referred to as 'terminal voltage' or 'battery voltage') and generates (outputs) a voltage detection signal representing the sample value of the detected voltage.

The current sensor 212 is installed in the charging and discharging path connecting the target battery B and the charging and discharging unit 112, detects the charging and discharging current flowing through the target battery B during the charging and discharging process, and generates (outputs) a current detection signal representing the sample value of the detected current. As an example, the current sensor 212 may include a known current detection element such as a shunt resistor and/or a Hall sensor.

The temperature sensor 213 detects the temperature of the target battery B at the start time point, the end time point, or at least one time point between the two time points of the charging and discharging process, and generates (outputs) a temperature detection signal representing the sample value of the detected temperature. As the temperature sensor 213, a temperature detection means known in the art, such as a thermocouple, may be used.

At least two of the voltage sensor 211, the current sensor 212, and the temperature sensor 213 may be integrated in the form of a single chip.

The information input and output unit 230 is provided to receive input information related to the diagnosis of the target battery B from the user, or to output charging and discharging information and/or diagnosis result information of the target battery B in a form recognizable to the user. As an example, the information input and output unit 230 may include a monitor, a touch screen, a speaker, and/or a vibrator.

In hardware, the battery diagnosing unit 220 may be implemented using at least one of ASICs (application specific integrated circuits), DSPs (digital signal processors), DSPDs (digital signal processing devices), PLDs (programmable logic devices), FPGAs (field programmable gate arrays), microprocessors, and other electrical units to perform functions.

The battery diagnosing unit 220 may have a built-in memory. The memory may include, for example, at least one type of storage media among flash memory type, hard disk type, SSD (Solid State Disk) type, SDD (Silicon Disk Drive) type, and multimedia card micro type, random access memory (RAM), static random access memory (SRAM), read-only memory (ROM), electrically erasable programmable read-only memory (EEPROM), and programmable read-only memory (PROM). The memory may store data and programs required for later-described operations by the battery diagnosing unit 220.

The memory may store data collected and generated while the operations and functions of the battery sensing unit 210 and the battery diagnosing unit 220 are performed. The memory may be internal or external to the battery diagnosing unit 220, and may be operably coupled to the battery diagnosing unit 220 by various well-known means, such as a data bus.

Figure 2:
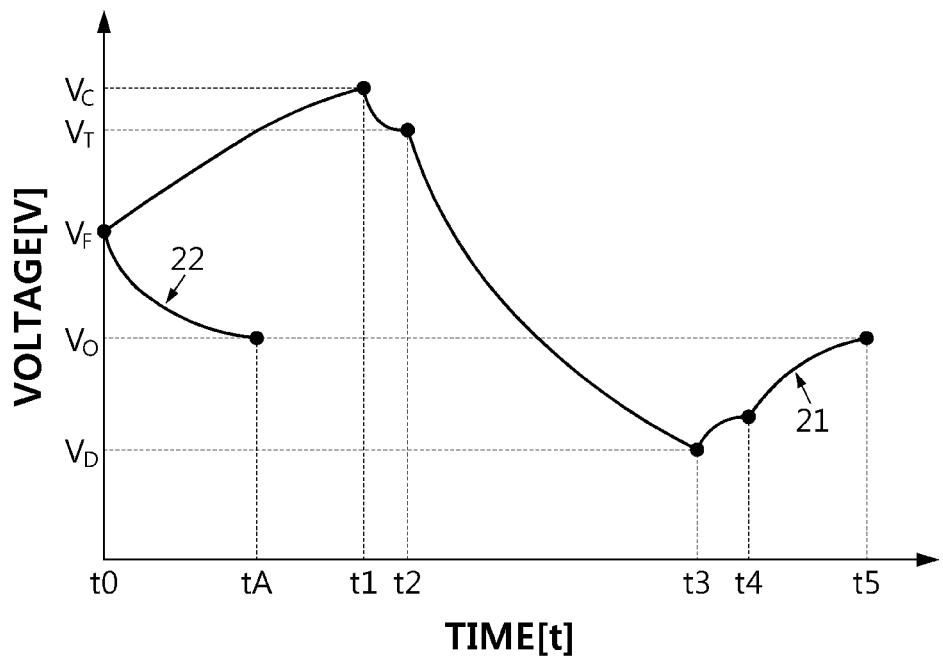
FIG. 2 is a graph illustrating the change in voltage of a battery during a first charging and discharging process used to diagnose defects of a target battery during a conventional defect inspection process.

FIG. 2 is a drawing referenced to comparatively explain a first charging and discharging process used to diagnose defects of a target battery and a conventional defect inspection process.

Referring to FIG. 2, the X-axis represents time and the Y-axis represents voltage. The curve 21 illustrates the change in voltage of the target battery B over time when applying the conventional defect inspection process, and the curve 22 illustrates the change in voltage of the target battery B over time when applying the first charging and discharging process according to the present disclosure.

Looking at the curve 21, t0 is the end time point of the activation process or a time point that a predetermined rest time or more has elapsed from when the completion of the activation process.

t1 is the time point when the voltage of the target battery B reaches the charging end voltage ($V_C$). In other words, it corresponds to the conventional full charge process. t2 is the time point when a predetermined rest time has elapsed from t1. The polarization voltage of the target battery B generated by charging from t0 to t1 is partially resolved during t1 to t2, and accordingly, the voltage of the target battery B may gradually decrease from t1 to t2. t3 is the time point when the voltage of the target battery B reaches the discharging end voltage ($V_D$). t4 is the time point when a predetermined rest time has elapsed from t3. The polarization voltage of the target battery B generated by discharge from t2 to t3 is partially resolved during t3 to t4, and accordingly, the voltage of the target battery B may rise gently from t3 to t4. t5 is the time point when the voltage of the target battery B reaches the target voltage ($V_O$) by the shipping charge process. For reference, the rest period from t1 to t2 can be omitted, and in this case, $V_T$ can be treated as the same as $V_C$.

In the curve 21, the period from t0 to t1 corresponds to the progress period of the conventional full charge process. Additionally, the period from t1 to t3 or t2 to t3 corresponds to the progress period of the conventional complete discharging process. Additionally, the period from t3 to t5 or t4 to t5 is the progress period of the conventional shipping charge process. According to the conventional defect inspection process, the full charge capacity of the target battery B is calculated from the integrated amount of the discharging current monitored over the period from t2 to t3. In addition, the total time required to recharge the target battery B to a shippable state after diagnosing whether the target battery B is defective through the conventional defect inspection process is (t5-t0).

Next, looking at the curve 22, unlike the curve 21, the voltage of the target battery B is decreasing from t0 to tA without going through the full charging process and the full discharging process as the target battery B is discharged from t0. In other words, if it is possible to determine whether the target battery B is defective by analyzing the curve 22, which represents the voltage change history of the target battery B in the first voltage range of interest ($V_F$ to $V_O$), the period for collecting the charging and discharging information may be significantly shortened compared to the conventional defect inspection process, and the power used for charging and discharging can be saved accordingly.

Figure 3:
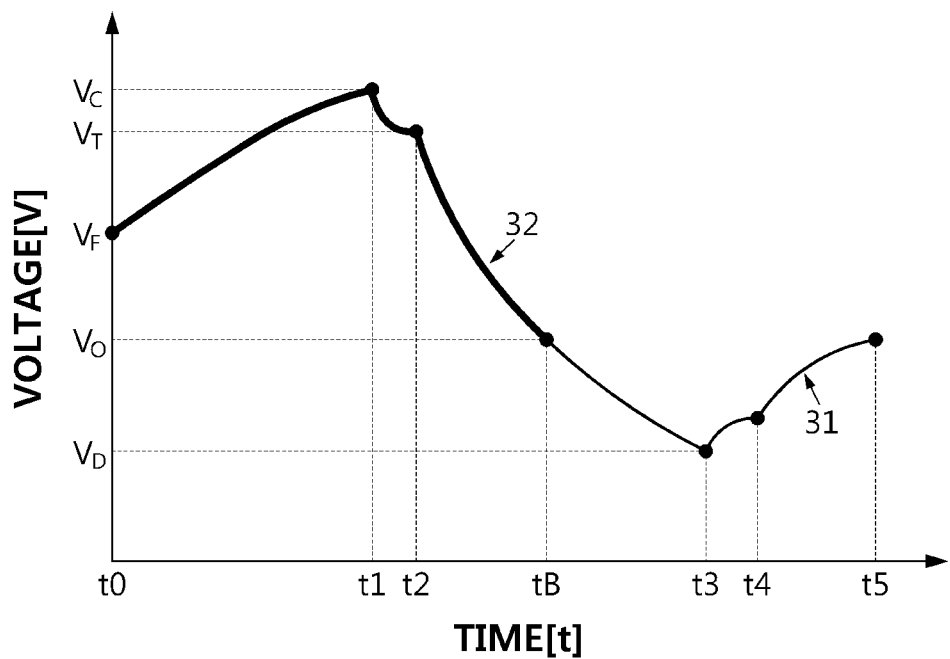
FIG. 3 is a graph illustrating the change in voltage of a battery during a second charging and discharging process used to diagnose defects of the target battery during the conventional defect inspection process.

FIG. 3 is a drawing referenced to comparatively explain a second charging and discharging process used to diagnose defects of the target battery and the conventional defect inspection process.

Referring to FIG. 3, the X axis represents time, the Y axis represents voltage, the curve 31 is the same as the curve 21 shown in FIG. 2, and the curve 32 illustrates the change in voltage of the target battery B over time when applying the second charging and discharging process according to the present disclosure.

In the curve 32, tB represents the end time point of the second charging and discharging process according to the present disclosure. That is, the curve 32 is a part of the curve 31 and corresponds to the time range from t0 to tB among the entire time range from t0 to t5. In FIG. 3, the common parts of the curve 31 and the curve 32 are indicated with thick lines.

The battery diagnosing apparatus 200 may determine whether the target battery B is defective by analyzing the partial charging and discharging information of the target battery B in the second voltage range of interest ($V_T$ to $V_O$) collected during the period (t2 to tB) during which the second shipping discharging process of the second charging and discharging process is executed. In this case, as described above with reference to FIG. 2, there is an advantage in that the time required is shortened and the amount of power required is reduced compared to the conventional defect inspection process.

The battery diagnosing unit 220 may determine a representative temperature value of the target battery B based on at least one data point of the temperature time series in a time section (may be referred to as 'period of interest') corresponding to the voltage range of interest. For example, the first period of interest associated with the first charging and discharging process may be t0 to tA (see FIG. 2), and the second period of interest associated with the second charging and discharging process may be t2 to tB (see FIG. 3).

When the first charging and discharging process is executed among the first and second charging and discharging processes, the battery diagnosing unit 220 may determine the representative temperature value of the target battery B to be equal to the temperature sample value at the start time point (t0) or the end time point (tA) of the first charging and discharging process, the temperature sample value at a specific time point within the time range (t0 to tA), or the average value of temperature sample values of at least two time points within the time range (t0 to tA).

As another example, when the second charging and discharging process is executed among the first and second charging and discharging processes, the battery diagnosing unit 220 may determine the representative temperature value of the target battery B to be equal to the temperature sample value at the start time point (t2), the temperature sample value at the end time point (tB), the temperature sample value at a specific time point within the time range (t2 to tB), or the average value of temperature sample values of at least two time points within the time range (t2 to tB).

The memory of the battery diagnosing unit 220 stores a predetermined plurality of comparison voltage profiles. The plurality of comparison voltage profiles are obtained from criterion battery(s) verified as normal and are one-to-one related to a plurality of different criterion temperature values.

The battery diagnosing unit 220 may select any one comparison voltage profile among the plurality of comparison voltage profiles, which is associated with one criterion temperature value with the minimum temperature difference with the representative temperature value among the plurality of criterion temperature values, as the criterion voltage profile.

Alternatively, the battery diagnosing unit 220 may select, as the criterion voltage profile, the average of two comparison voltage profiles associated with two criterion temperature values that define the narrowest temperature range to which the representative temperature value belongs among the plurality of criterion temperature values. For example, if the plurality of criterion temperature values are 21° C., 22° C., 23° C., 24° C., 25° C., and 26° C. and the representative temperature value is 24.8° C., the criterion voltage profile may be generated by calculating the average of two reference voltage profiles associated with 24° C. and 25° C.

The criterion voltage profile will be described in detail later with reference to FIG. 4 and the like.

The battery diagnosing unit 220 may generate a voltage profile (may be referred to as a 'Q-V profile') based on the partial charging and discharging information collected and recorded during the charging and discharging process. That is, the battery diagnosing unit 220 may repeat the operation of mapping the voltage sample value and the current sample value monitored by the battery sensing unit 210 at each measurement timing and recording them in the memory, and generate a voltage profile by processing the partial charging and discharging information of the total recorded charging and discharging information corresponding to the voltage range of interest.

The voltage profile represents the correspondence between the accumulated capacity (current integration value) and the voltage in a time range (period of interest) corresponding to the voltage range of interest.

As an example, referring to FIG. 2, when the first charging and discharging process is executed among the first charging and discharging process and the second charging and discharging process, the period from t0 to tA is the time range corresponding to the first voltage range of interest ($V_F$ to $V_O$). The battery diagnosing unit 220 may generate a measurement voltage profile related to the first charging and discharging process by mapping the accumulated capacity and the voltage at each measurement timing in the corresponding period (t0 to tA).

As another example, referring to FIG. 3, when the second charging and discharging process is executed among the first charging and discharging process and the second charging and discharging process, the period from t2 to tB is the time range corresponding to the second voltage range of interest ($V_T$ to $V_O$). The battery diagnosing unit 220 may generate a measurement voltage profile related to the second charging and discharging process by mapping the accumulated capacity and the voltage at each measurement timing of the corresponding period (t2 to tB).

From now on, the battery diagnosis process that utilizes the measurement voltage profile of the target battery B will be explained in more detail.

The battery diagnosing unit 220 may determine whether at least one of the full charge capacity and the internal resistance of the target battery B is abnormal by comparing the measurement voltage profile of the target battery B with the criterion voltage profile.

The criterion voltage profile represents the correspondence between the accumulated capacity and the voltage of a criterion battery that has been verified to be normal. In that the criterion voltage profile represents the correspondence between the accumulated capacity and the voltage of the criterion battery in the available voltage range (e.g., $V_C$ to $V_D$, $V_T$ to $V_D$), the correspondence between the accumulated capacity and the voltage of the target battery B in the voltage range of interest narrower than the available voltage range is different from the measurement voltage profile.

The battery diagnosing unit 220 diagnoses abnormality of the target battery B by comparing the measurement voltage profile with the criterion voltage profile.

In detail, the battery diagnosing unit 220 may generate an adjusted measurement voltage profile by adjusting the measurement voltage profile to correspond to the criterion voltage profile.

Corresponding to the criterion voltage profile means that the error amount with the criterion voltage profile is minimal or within a predetermined tolerance range. Here, the error amount between the criterion voltage profile and the adjusted measurement voltage profile may be the sum of squares, the root mean square error (RMSE), or the integral of the voltage difference between the adjusted measurement voltage profile and the criterion voltage profile over a specific capacity range, or an integral value of an absolute value of the voltage difference.

The adjusted measurement voltage profile used for diagnosing abnormality is one of the plurality of adjusted measurement voltage profiles obtained while minutely adjusting the measurement voltage profile to various levels. The battery diagnosing unit 220 may calculate the root mean square error (RMSE) of the criterion voltage profile and each of the plurality of adjusted measurement voltage profiles obtained from the measurement voltage profile, and specify any one of the plurality of adjusted measurement voltage profiles with the minimum RMSE as a profile used to determine whether the target battery B is defective.

Adjustment logics in that the battery diagnosing unit 220 performs for each measurement voltage profile to correspond to the criterion voltage profile will be described in more detail later with reference to FIGS. 4 to 8.

The battery diagnosing unit 220 may generate main adjustment information indicating the adjustment level from the measurement voltage profile to the adjusted measurement voltage profile. The main adjustment information may be a data set that defines how and to what extent the measurement voltage profile is adjusted to generate an adjusted measurement voltage profile.

The adjustment process from the measurement voltage profile to the adjusted measurement voltage profile essentially includes the first adjustment logic (X-axis scaling), and may optionally further include at least one of the second adjustment logic (X-axis shifting), the third adjustment logic (Y-axis scaling), and the fourth adjustment logic (Y-axis shifting).

The first adjustment logic (X-axis scaling) may be an operation to contract or expand the measurement voltage profile along the X-axis (corresponding to the first axis of the claims). The adjustment result value by the first adjustment logic may be referred to as capacity scaling amount (or capacity scaling factor). For example, a capacity scaling factor of 103% means that the capacity range of the adjusted measurement voltage profile is 1.03 times the capacity range of the measurement voltage profile.

The second adjustment logic (X-axis shifting) may be an operation that moves the measurement voltage profile entirely along the X-axis (capacity). The adjustment result value by the second adjustment logic may be referred to as capacity shift amount (or capacity shifting factor). For example, a capacity shifting factor of −2.2 Ah means that the adjusted measurement voltage profile is located to the left (low capacity) by 2.2 Ah compared to the measurement voltage profile as a whole.

The third adjustment logic (Y-axis scaling) may be an operation to contract or expand the measurement voltage profile along the Y-axis (corresponding to the second axis of the claims). The adjustment result value by the third adjustment logic may be referred to as voltage scaling amount (or voltage scaling factor). For example, a voltage scaling factor of 101% means that the voltage range of the adjusted measurement voltage profile is 1.01 times the voltage range of the measurement voltage profile, and a voltage shifting factor of 98% means that the voltage range of the adjusted measurement voltage profile is 0.98 times the voltage range of the measurement voltage profile.

The fourth adjustment logic (Y-axis shifting) may be an operation that moves the measurement voltage profile entirely along the Y-axis (voltage). The adjustment result value by fourth adjustment logic may be referred to as voltage shift amount (or voltage shifting factor). For example, a voltage shifting factor of +0.1 V means that the adjusted measurement voltage profile is located higher (higher voltage) by 0.1 V than the measurement voltage profile as a whole.

The main adjustment information may include the adjustment result value according to the first adjustment logic, and may further include at least one of the adjustment result values according to the second to fourth adjustment logics. Additionally, the adjustment result values of the first to fourth adjustment logics associated with the criterion voltage profile may be defaulted to 0 V, 100%, 0 Ah, and 100%, respectively. For reference, units other than V, Ah and % may be used as units of adjustment result values.

The battery diagnosing unit 220 may be configured to identify whether the target battery B is defective based on the main adjustment information.

When the Y-axis length (i.e., capacity range) of the adjusted measurement voltage profile is relatively longer than the Y-axis length of the measurement voltage profile (e.g., enlargement, the capacity scaling factor exceeds 100%), the battery diagnosing unit 220 may identify that the full charge capacity of the battery related to the measurement voltage profile is smaller than the full charge capacity of the criterion battery by an amount corresponding to the adjustment information.

When the Y-axis length (i.e., capacity range) of the adjusted measurement voltage profile is relatively shorter than the Y-axis length of the measurement voltage profile (e.g., reduction, the capacity scaling factor is less than 100%), the battery diagnosing unit 220 may identify that the full charge capacity of the battery related to the measurement voltage profile is larger than the full charge capacity of the criterion battery by an amount corresponding to the adjustment information.

For example, when the full charge capacity of the criterion battery is 100 Ah, if the main adjustment information is 103%, the battery diagnosing unit 220 may determine that the full charge capacity of the target battery B related to the measurement voltage profile is smaller than the full charge capacity of the criterion battery by 3% p.

The battery diagnosing unit 220 may be configured to determine whether the target battery B has capacity abnormality by comparing the first adjustment result value of the target battery B with the first diagnosis criterion range. The fact that the first adjustment result value is within the first diagnosis criterion range means that the full charge capacity of the target battery B is at a normal level. The fact that the first adjustment result value is outside the first diagnosis criterion range may mean that the full charge capacity of the target battery B is excessively small or large beyond the allowable value compared to the original design capacity.

The battery diagnosing unit 220 may be configured to determine whether the target battery B has internal resistance abnormality by comparing the fourth adjustment result value of the target battery B with the second diagnosis criterion range. The fact that the second adjustment result value is within the second diagnosis criterion range means that the internal resistance of the target battery B is at a normal level. The fact that the second adjustment result value is outside the second diagnosis criterion range may mean that the internal resistance of the target battery B is excessively small or large beyond the allowable value compared to the internal resistance of the criterion battery.

FIGS. 4 to 8 are graphs referenced to explain adjustment logics executable to generate an adjusted measurement voltage profile from a measurement voltage profile. In each of the graphs shown in FIGS. 4 to 8, the X-axis represents capacity (Ah), and the Y-axis represents voltage (V).

Figure 4:
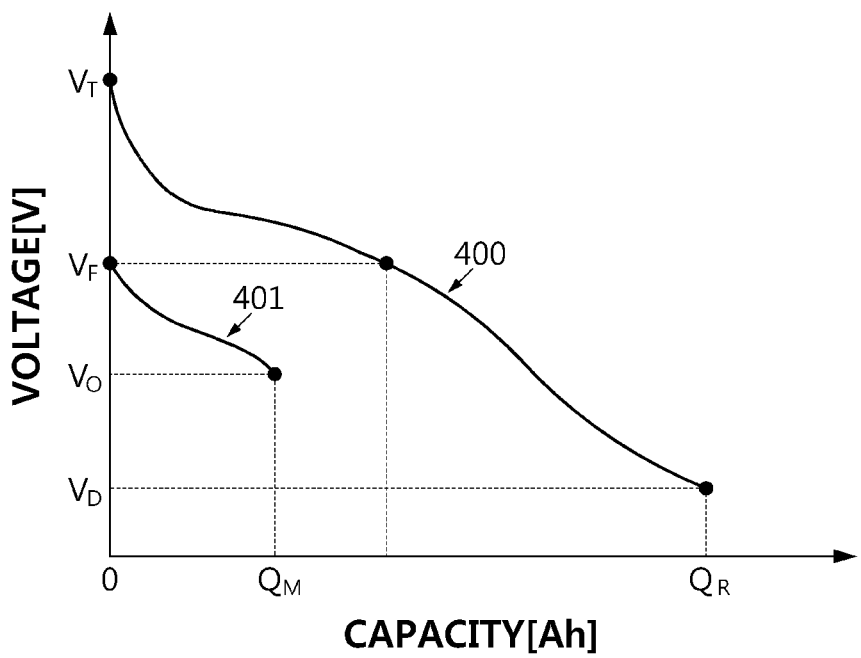
FIG. 4 is a graph illustrating a measurement voltage profile an a criterion voltage profile.

First, FIG. 4 is a diagram referenced to explain an example of the measurement voltage profile and an example of the criterion voltage profile.

Referring to FIG. 4, the criterion voltage profile 400 and the measurement voltage profile 401 are shown. For convenience of explanation, hereinafter, it is assumed that the measurement voltage profile 401 is generated from the partial charging and discharging information obtained in the first charging and discharging process among the first and second charging and discharging processes.

In that both the criterion voltage profile 400 and the measurement voltage profile 401 are based on the information collected during discharging, they show a pattern in which the voltage decreases as the accumulated capacity (integration value of discharging current) increases.

As described above, the criterion voltage profile 400 is for the available voltage range ($V_C$ to $V_D$ or $V_T$ to $V_D$) and is already stored in the memory. The measurement voltage profile 401 is generated from the partial charging and discharging information for the voltage range of interest ($V_F$ to $V_O$) that is narrower than the available voltage range ($V_C$ to $V_D$ Or $V_T$ to $V_D$). Therefore, the capacity range (0 to $Q_R$) of the criterion voltage profile 400 is wider than the capacity range (0 to $Q_M$) of the measurement voltage profile 401, and this point is also confirmed in FIG. 4. For reference, $Q_R$ may represent the full charge capacity of the criterion battery, which is identified from the current integration amount in the full discharge stage of the conventional defect inspection process.

If the performance and state of the target battery B are completely the same as the criterion battery, when shifting the measurement voltage profile 401 to the high capacity side along the X-axis, this completely overlaps with a portion of the criterion voltage profile 400 corresponding to the voltage range of interest ($V_F$ to $V_O$), or has only a slight difference that can be ignored. On the other hand, if it is assumed that the target battery B has a very serious level of defect, even if the measurement voltage profile 401 is shifted along the X-axis as well as the Y-axis, there may not be any portion overlapping with the criterion voltage profile 400.

Figure 5:
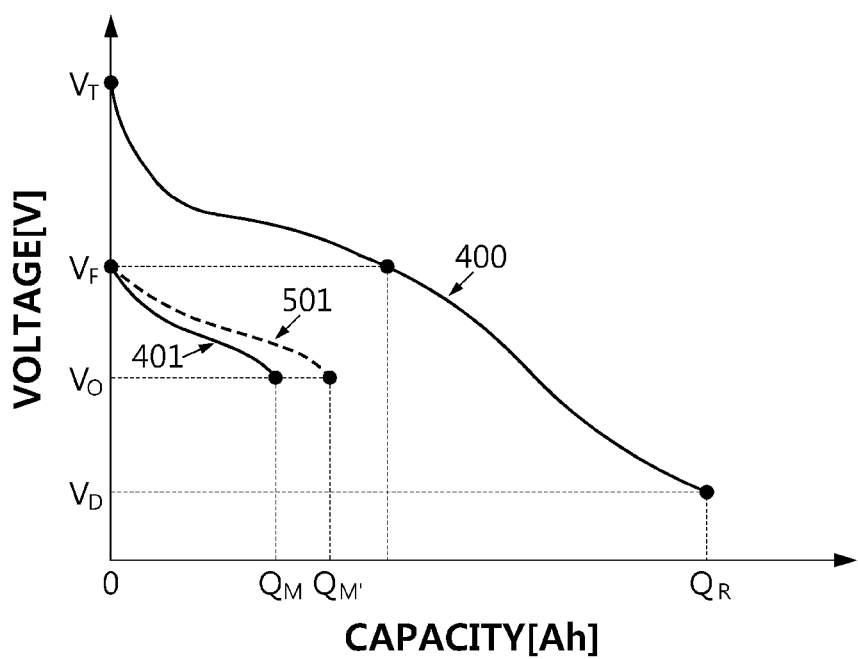
FIGS. 5 to 8 are graphs illustrating adjusted measurement voltage profiles from the measurement voltage profile.

FIG. 5 is a diagram referenced to exemplarily explain the first adjustment logic for the measurement voltage profile shown in FIG. 4.

Referring to FIG. 5, the battery diagnosing unit 220 may perform the first adjustment logic to scale (contract or expand) the measurement voltage profile 401 in the X-axis direction. The adjusted measurement voltage profile 501 illustrates a state in which the measurement voltage profile 401 is expanded along the X-axis by the first adjustment logic.

In other words, the battery diagnosing unit 220 may determine the adjustment result value (i.e., capacity scaling factor) of the first adjustment logic that minimizes the error amount by repeating the first adjustment logic that enlarges or reduces the measurement voltage profile 401 by a small percentage (e.g., 0.01%) along the X-axis and then monitors the error amount with the criterion voltage profile 400 (which can be referred to as 'first error amount').

For example, a capacity scaling factor of 110% means that the size of the capacity range (0 to QM') of the adjusted measurement voltage profile 501 is 1.1 times the capacity range (0 to QM) of the measurement voltage profile 401.

The adjusted measurement voltage profile 501 shown in FIG. 5 is the result of scaling the remaining portion by 1.1 times along the X-axis while keeping the start point of the measurement voltage profile 401 fixed.

When the battery diagnosing unit 220 finally specifies the adjustment result value of the first adjustment logic, it may be based on the error amount for a portion in which the common capacity ranges between the criterion voltage profile 400 and the adjusted measurement voltage profile 501 overlap with each other. For example, in FIG. 5, the capacity range of the adjusted measurement voltage profile 501 is 0 to QM' Ah, while the capacity range of the criterion voltage profile 400 is 0 to $Q_R$ Ah, so the adjustment result value of the first adjustment logic is determined based on the error amount in the overlapping portion of these two ranges, 0 to QM' Ah.

Figure 6:
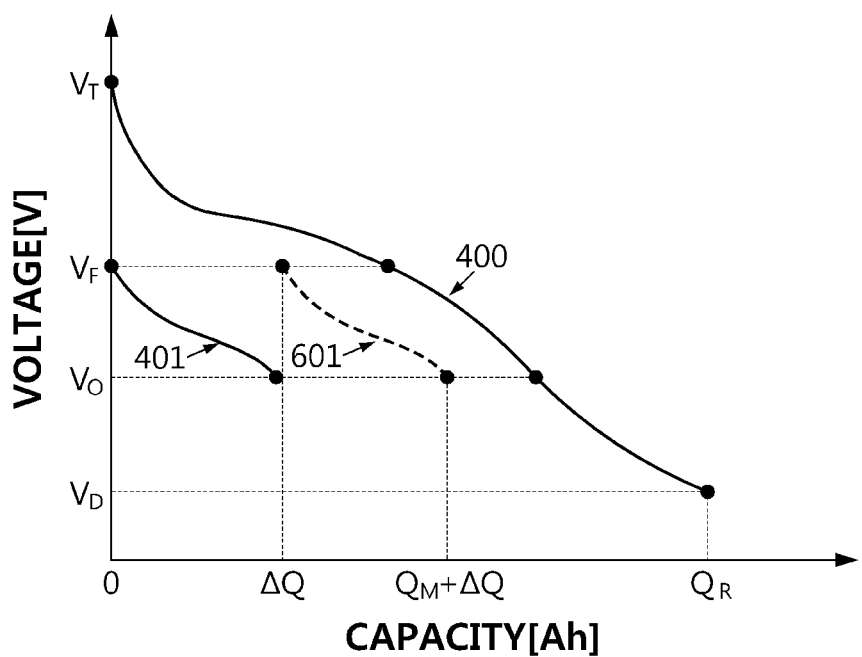

FIG. 6 is a diagram referenced to exemplarily explain the second adjustment logic for the measurement voltage profile 401 shown in FIG. 4.

Referring to FIG. 6, in the voltage range ($V_F$ to $V_O$) common to the two profiles 400, 401, the measurement voltage profile 401 is located at the lower capacity side than the criterion voltage profile 400, so it can be seen that the error amount between the measurement voltage profile 401 and the criterion voltage profile 400 will decrease if the measurement voltage profile 401 is shifted to the high capacity side along the X-axis.

The battery diagnosing unit 220 may repeat the second adjustment logic that shifts the measurement voltage profile 401 by a small amount (e.g., 0.01 Ah) in the X-axis direction and then monitors the error amount with the criterion voltage profile 400. The adjusted measurement voltage profile 601 is the result of the measurement voltage profile 401 shifted by ΔQ in the Y-axis direction. The adjustment result value (i.e., capacity shifting factor) of the second adjustment logic that minimizes the error amount can be determined.

Figure 7:
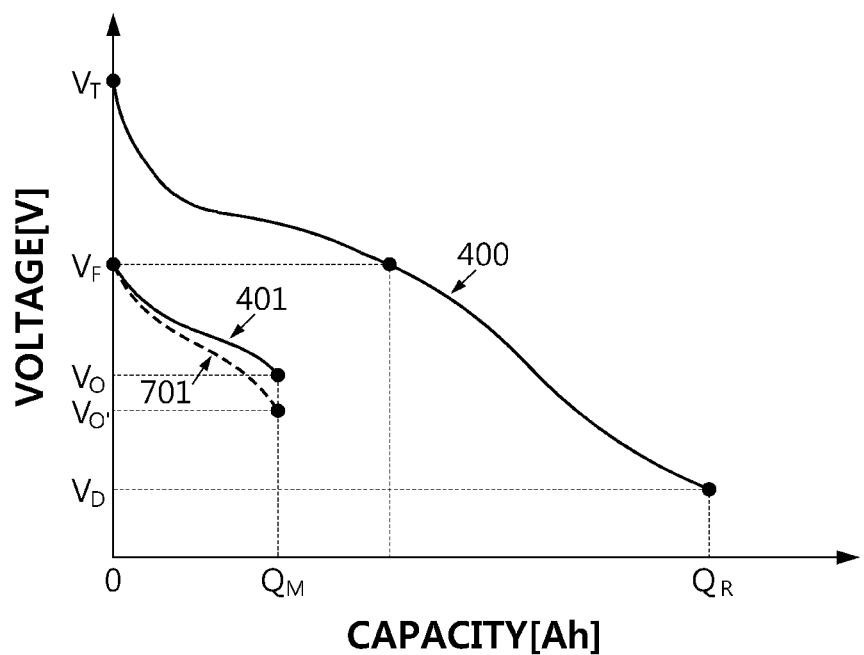

FIG. 7 is a diagram referenced to exemplarily explain the third adjustment logic for the measurement voltage profile 401 shown in FIG. 4.

Referring to FIG. 7, the battery diagnosing unit 220 may perform the third adjustment logic that scales (contracts or expands) the measurement voltage profile 401 in the Y-axis direction.

The battery diagnosing unit 220 may determine the adjustment result value (i.e. voltage scaling factor) of the third adjustment logic that minimizes the error amount by repeating the third adjustment logic that expands or contracts the measurement voltage profile 401 by a small percentage (e.g., 0.01%) along the Y-axis and then monitors the error amount with the criterion voltage profile 400.

The adjusted measurement voltage profile 701 shown in FIG. 7 is the result of expanding the remaining portion along the Y-axis while the start point of the measurement voltage profile 401 is fixed. Therefore, the voltage ($V_O'$) at the end point of the adjusted measurement voltage profile 701 is smaller than the voltage ($V_O$) at the end point of the measurement voltage profile 401.

The adjustment result value of the third adjustment logic is the ratio of the size of the voltage range of the adjusted measurement voltage profile 701 to the size of the voltage range of the measurement voltage profile 401. For example, the adjustment result value of the third adjustment logic is $V_O'/V_O*100\% = 110\%$.

Figure 8:
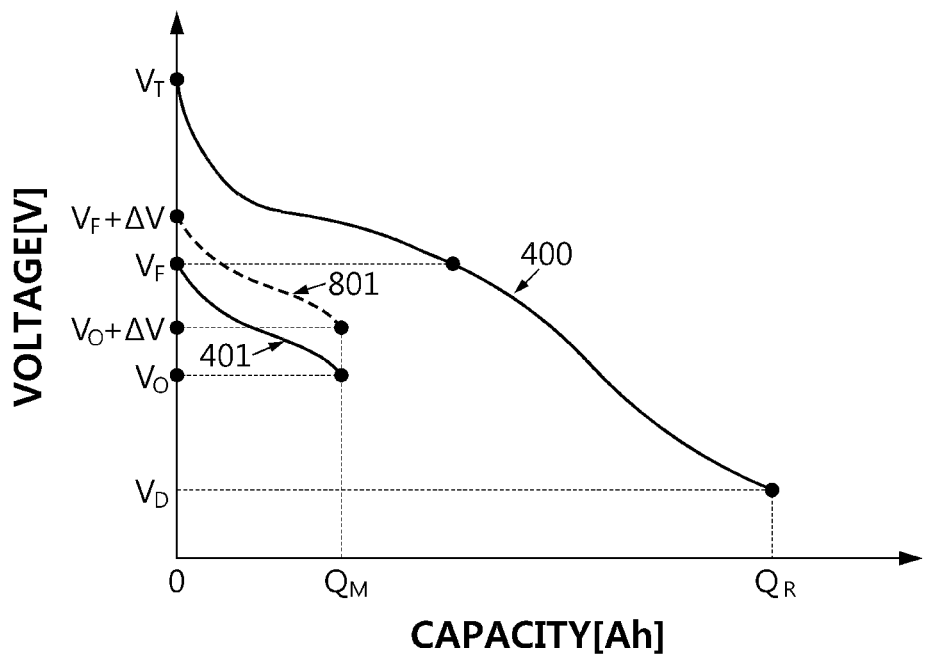

FIG. 8 is a diagram referenced to exemplarily explain the fourth adjustment logic for the measurement voltage profile 401 shown in FIG. 4.

Referring to FIG. 8, the battery diagnosing unit 220 may perform the fourth adjustment logic that shifts the measurement voltage profile 401 in the Y-axis direction while keeping the criterion voltage profile 400 fixed. The adjusted measurement voltage profile 801 is the result of moving the measurement voltage profile 401 to the high voltage side by ΔV along the Y-axis.

The battery diagnosing unit 220 may determine the adjustment result value (i.e. voltage shifting factor) of the third adjustment logic that minimizes the error amount by repeating the third adjustment logic that shifts the measurement voltage profile 401 in the Y-axis direction by a small amount (e.g., 0.001 V) and then monitors the error amount with the criterion voltage profile 400.

So far, with reference to FIGS. 4 to 8, the procedure for generating the corresponding adjusted measurement voltage profiles 501, 601, 701, 801 from the measurement voltage profile 401 by individually executing the first to fourth adjustment logics has been described.

In relation to this, the first to fourth adjustment logics are executed at least twice for the measurement voltage profile 401. Additionally, unlike the examples of FIGS. 4 to 8, in each adjustment process, an adjusted measurement voltage profile may be generated for each combination of at least two or more adjustment result values among the first to fourth adjustment logics. For example, in a specific adjustment process, the first to fourth adjustment logics may be executed once, and accordingly, a new adjusted measurement voltage profile may be generated by applying the adjustment result value (e.g., 101%) by the first adjustment logic, the adjustment result value (e.g., +5.5 Ah) by the second adjustment logic, the adjustment result value (e.g., 99%) by the third adjustment logic and the adjustment result value (e.g., −0.05 V) by the fourth adjustment logic to the measurement voltage profile 401.

Figure 9:
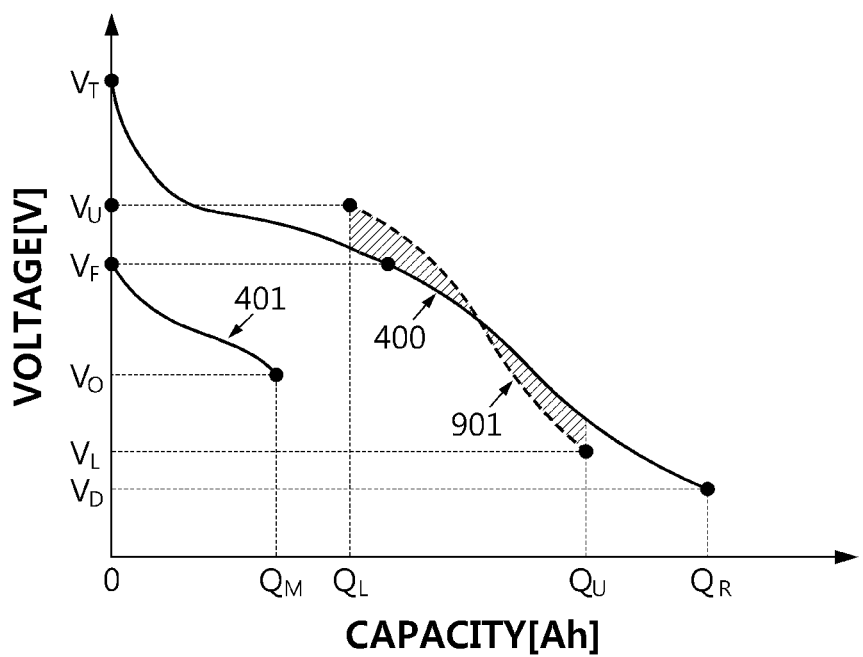
FIG. 9 is a graph illustrating the error amount between the criterion voltage profile and an adjusted measurement voltage profile.

FIG. 9 is a diagram referenced to explain a process for calculating the error amount between the criterion voltage profile and the adjusted measurement voltage profile.

The adjusted measurement voltage profile 901 shown in FIG. 9 illustrates the results of applying all of the first to fourth adjustment logics to the measurement voltage profile 401.

Referring to FIG. 9, the following several facts may be confirmed through comparison between the measurement voltage profile 401 and the adjusted measurement voltage profile 901.

First, the size of the capacity range of the adjusted measurement voltage profile 901 is less than the size of the capacity range of the measurement voltage profile 401, which indicates that the adjustment result value (capacity scaling factor) of the first adjustment logic is less than 100%.

Second, the start point of the adjusted measurement voltage profile 901 is located at the higher capacity side than the start point of the measurement voltage profile 401, which indicates that the adjustment result value (capacity shifting factor) of the second adjustment logic is a positive value.

Third, the size of the voltage range of the adjusted measurement voltage profile 901 is larger than the size of the voltage range of the measurement voltage profile 401, which indicates that the adjustment result value (voltage scaling factor) of the third adjustment logic exceeds 100%.

Fourth, the start point of the adjusted measurement voltage profile 901 is located at the higher voltage side than the start point of the measurement voltage profile 401, which indicates that the adjustment result value (voltage shifting factor) of the fourth adjustment logic is a positive value.

The battery diagnosing unit 220 may set the common capacity range of the criterion voltage profile 400 and the adjusted measurement voltage profile 901 as the capacity range of interest. As shown in FIG. 9, when the capacity range ($Q_L$ to $Q_U$) of the adjusted measurement voltage profile 901 is within the capacity range (0 to $Q_R$) of the criterion voltage profile 400, the capacity range of interest is the same as the capacity range ($Q_L$ to $Q_U$) of the adjusted measurement voltage profile 901.

Next, the battery diagnosing unit 220 may determine the error amount (e.g., RMSE) of the adjusted measurement voltage profile 901 to the criterion voltage profile 400 by searching for the discrepancy portion (shaded area in FIG. 9) between the criterion voltage profile 400 and the adjusted measurement voltage profile 901 in the capacity range of interest ($Q_L$ to $Q_U$).

For reference, the battery diagnosing unit 220 may calculate the length of the measurement voltage profile 401 and the length of the adjusted measurement voltage profile (e.g., 901) using various known methods. As an example, the battery diagnosing unit 220 may calculate the length of an arbitrary profile using the following formula.

$$L = \int_a^b \sqrt{1 + f'(x)^2}\, dx \quad \text{[Formula]}$$

In the above formula, L means the length of an arbitrary profile, f(x) is a function representing an arbitrary profile (e.g., measurement voltage profile, adjusted measurement voltage profile), and f' (x) represents the derivative of f(x). Additionally, a and b are the lower and upper limits of the capacity range for which the length is to be calculated.

The battery diagnosing unit 220 may calculate the length of each of the criterion voltage profile 400, the measurement voltage profile 401, and the adjusted measurement voltage profile (e.g., 901) using the above formula.

Accordingly, a significant number of adjusted measurement voltage profiles, including the five profiles 501, 601, 701, 801, 901 shown in FIGS. 5 to 9, can be generated from the measurement voltage profile 401, and among them, only a single adjusted measurement voltage profile with a minimum error amount of with the criterion voltage profile 400 may be selected by the battery diagnosing unit 220 to determine whether the target battery B is abnormal.

When the adjusted measurement voltage profile 901 of FIG. 9 is finally selected for determining whether the target battery B is abnormal, the battery diagnosing unit 220 may add the ratio of the length of the adjusted measurement voltage profile 901 to the length of the measurement voltage profile 401 to the main adjustment information related to the measurement voltage profile 401.

The battery diagnosing unit 220 may diagnose whether the full charge capacity of the target battery B is abnormal based on the adjustment result value (capacity scaling factor) associated with the first adjustment logic included in the main adjustment information.

Additionally, the battery diagnosing unit 220 may diagnose whether the internal resistance of the target battery B is abnormal based on the adjustment result value (capacity scaling factor) associated with the fourth adjustment logic included in the main adjustment information.

When diagnosing the target battery B, the battery diagnosing unit 220 may additionally utilize at least one of differential voltage information and differential capacity information of the criterion voltage profile 400 and the measurement voltage profile 401, respectively. Hereinafter, with reference to FIGS. 10 and 11, an embodiment of obtaining differential voltage information and differential capacity information by analyzing the measurement voltage profile 401 will be described separately.

Figure 10:
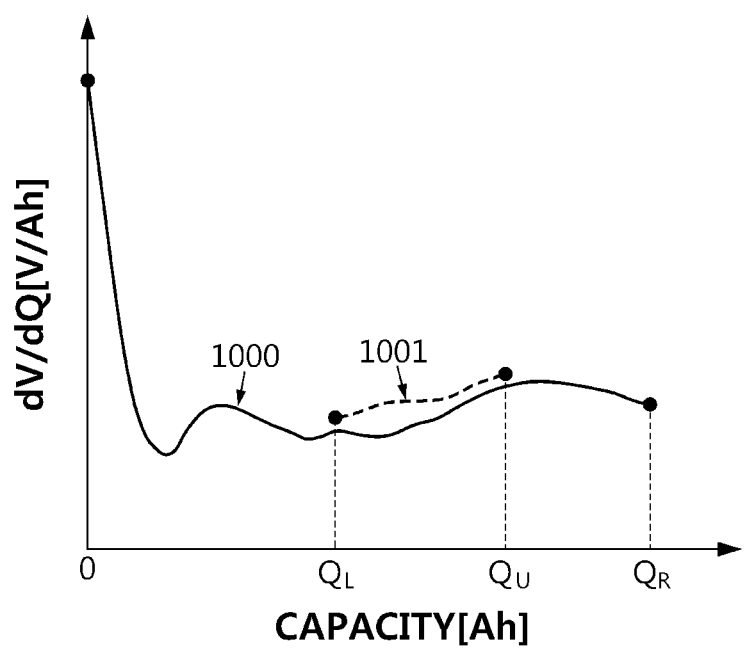
FIG. 10 is a graph illustrating a differential voltage profile generated from the adjusted measurement voltage profile of FIG. 9.

FIG. 10 is a diagram referenced to explain the differential voltage profile generated from the adjusted measurement voltage profile of FIG. 9. In FIG. 10, the X-axis represents capacity, and the Y-axis represents differential voltage (dV/dQ).

The battery diagnosing unit 220 may generate the differential voltage profile 1001 from each adjusted measurement voltage profile (e.g., 901) generated each time the adjustment process for the measurement voltage profile 401 of the target battery B is performed.

The differential voltage profile 1001 shown in FIG. 10 shows the relationship between (i) the accumulated capacity (Q) and (ii) the differential voltage (dV/dQ) of the adjusted voltage profile 901 shown in FIG. 9. dV/dQ is the ratio of voltage change (dV) to minute capacity (dQ). In other words, the differential voltage (dV/dQ) is the change rate of voltage with respect to the accumulated capacity.

The battery diagnosing unit 220 may generate the criterion differential voltage profile 1000 from the criterion voltage profile 400 through the same method. Alternatively, the criterion differential voltage profile 1000 may also be pre-stored in the memory, like the criterion voltage profile 400.

The battery diagnosing unit 220 may calculate the error amount between the criterion differential voltage profile 1000 and the differential voltage profile 1001 in a common capacity range of the criterion differential voltage profile 1000 and the differential voltage profile 1001. Here, the error amount (can be referred to as 'second error amount') between the criterion differential voltage profile 1000 and the differential voltage profile 1001 may be the sum of squares, the root mean square error (RMSE), or an integral value of the differential voltage difference in the common capacity range ($Q_L$ to $Q_U$), or an integral value of the absolute value of the differential voltage difference.

Figure 11:
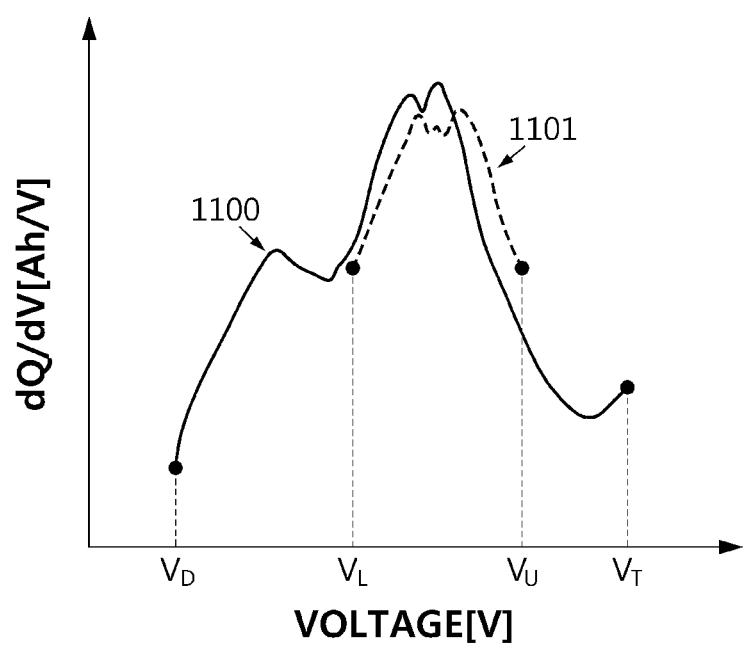
FIG. 11 is a graph illustrating a differential capacity profile generated from the adjusted measurement voltage profile of FIG. 9.

FIG. 11 is a diagram referenced to explain the differential capacity profile generated from the adjusted measurement voltage profile of FIG. 9. In FIG. 11, the X-axis represents voltage, and the Y-axis represents differential capacity (dQ/dV).

The battery diagnosing unit 220 may generate the differential capacity profile 1101 from each adjusted measurement voltage profile (e.g., 901) generated each time the adjustment process for the measurement voltage profile 401 of the target battery B is performed.

The differential capacity profile 1101 shown in FIG. 11 shows the relationship between (i) the voltage (V) and (ii) the differential capacity (dQ/dV) of the adjusted voltage profile 901 shown in FIG. 9. dQ/dV is the ratio of the capacity change (dQ) to the minute voltage (dV). In other words, the differential capacity (dQ/dV) is the rate of change of the accumulated capacity with respect to voltage.

The battery diagnosing unit 220 may generate the criterion differential capacity profile 1100 from the criterion voltage profile 400 through the same method. Alternatively, the criterion differential capacity profile 1100 may be pre-stored in the memory.

The battery diagnosing unit 220 may calculate the error amount between the criterion differential capacity profile 1100 and the differential capacity profile 1101 in a common voltage range of the criterion differential capacity profile 1100 and the differential capacity profile 1101. Here, the error amount (may be referred to as 'third error amount') between the criterion differential capacity profile 1100 and the differential capacity profile 1101 is the sum of squares, the root mean square error (RMSE), or an integral value of the differential capacity difference in the common voltage range ($V_L$ to $V_U$), or may be an integral value of the absolute value of the differential capacity difference.

The battery diagnosing unit 220 essentially calculates the first error amount of the adjusted measurement voltage profile for the criterion voltage profile 400 whenever a new adjusted measurement voltage profile is generated. In addition, the battery diagnosing unit 220 may further optionally calculate at least one of the second error amount between the differential voltage profile and the criterion differential voltage profile 1000 for each adjusted measurement voltage profile and the third error amount between the adjusted differential capacity profile and the criterion differential capacity profile 1100.

For example, through comparison between the adjusted measurement voltage profile 901 and the criterion voltage profile 900, the first error amount associated with the adjusted measurement voltage profile 901 is calculated. Additionally, through comparison between the differential voltage profile 1001 and the criterion differential voltage profile 1000, the second error amount associated with the adjusted measurement voltage profile 901 is calculated. Additionally, through comparison between the differential capacity profile 1101 and the criterion differential capacity profile 1100, the third error amount associated with the adjusted measurement voltage profile 901 is calculated.

When only the first error amount among the first to third error amounts is calculated for each adjusted measurement voltage profile, the battery diagnosing unit 220 selects one adjusted measurement voltage profile with the minimum first error amount among the plurality of adjusted measurement voltage profiles to diagnose abnormality of the target battery B.

Alternatively, when only the first and second error amounts among the first to third error amounts are calculated for each adjusted measurement voltage profile, the battery diagnosing unit 220 selects one adjusted measurement voltage profile with the minimum average value (e.g., arithmetic average, weighted average) of the first error amount and the second error amount among the plurality of adjusted measurement voltage profiles for diagnosing abnormality of the target battery B.

Alternatively, when only the first and third error amounts among the first to third error amounts are calculated for each adjusted measurement voltage profile, the battery diagnosing unit 220 selects one adjusted measurement voltage profile with the minimum average value of the first error amount and the third error amount among the plurality of adjusted measurement voltage profiles for diagnosing abnormality of the target battery B.

Alternatively, when all the first to third error amounts are calculated for each adjusted measurement voltage profile, the battery diagnosing unit 220 selects one adjusted measurement voltage profile with the minimum average value of the first to third error amounts among the plurality of adjusted measurement voltage profiles for diagnosing abnormality of the target battery B.

Figure 12:
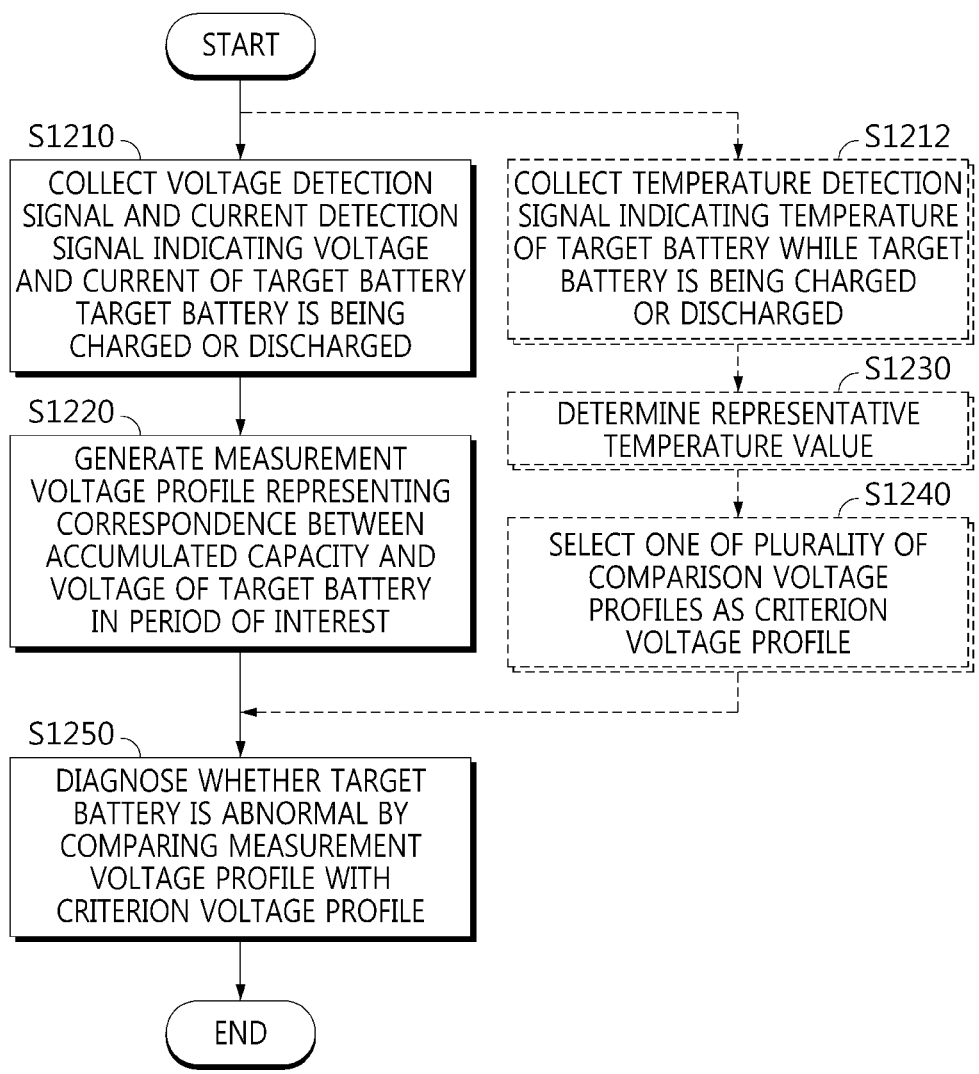
FIG. 12 is a flowchart schematically showing a battery diagnosing method according to another embodiment of the present disclosure.

FIG. 12 is a flowchart schematically showing a battery diagnosing method according to another embodiment of the present disclosure. The battery diagnosing apparatus 200 may execute the method according to FIG. 12 in response to the start of the first charging and discharging process or the second charging and discharging process.

Referring to FIGS. 1 to 12, in step S1210, the battery diagnosing unit 220 collects a voltage detection signal and a current detection signal indicating the voltage and current of the target battery B from the battery sensing unit 210 while the target battery B is being charged or discharged.

In step S1212, the battery diagnosing unit 220 may collect a temperature detection signal indicating the temperature of the target battery B from the battery sensing unit 210 in parallel with step S1210.

In step S1220, the battery diagnosing unit 220 generates a measurement voltage profile 401 representing the correspondence between the accumulated capacity and voltage of the target battery B in the period of interest from the first time point at which the voltage of the target battery B reaches one of the upper limit ($V_F$) and the lower limit ($V_O$) of the voltage range of interest ($V_F$ to $V_O$) to the second time point at which the voltage of the target battery B reaches the other one of the upper limit ($V_F$) and the lower limit ($V_O$) of the voltage range of interest by monitoring the voltage and current of the target battery B based on the voltage detection signal and the current detection signal.

In step S1230, the battery diagnosing unit 220 determines a representative temperature value based on the temperature detection signal collected in step S1212. The representative temperature value may represent the temperature of the target battery B at the first time point or the second time point, or may represent the average temperature of the target battery B during the period of interest.

In step S1240, the battery diagnosing unit 220 selects one of the plurality of comparison voltage profiles previously stored in the memory as the criterion voltage profile, based on the representative temperature value.

In step S1250, the battery diagnosing unit 220 diagnoses whether the target battery B is abnormal by comparing the measurement voltage profile 401 with the criterion voltage profile 400.

Step S1212, step S1230, and step S1240 described above are not essential and therefore may be omitted from FIG. 12. If step S1212, step S1230, and step S1240 are omitted, the criterion voltage profile used in step S1250 may be given in advance regardless of battery temperature.

Figure 13:
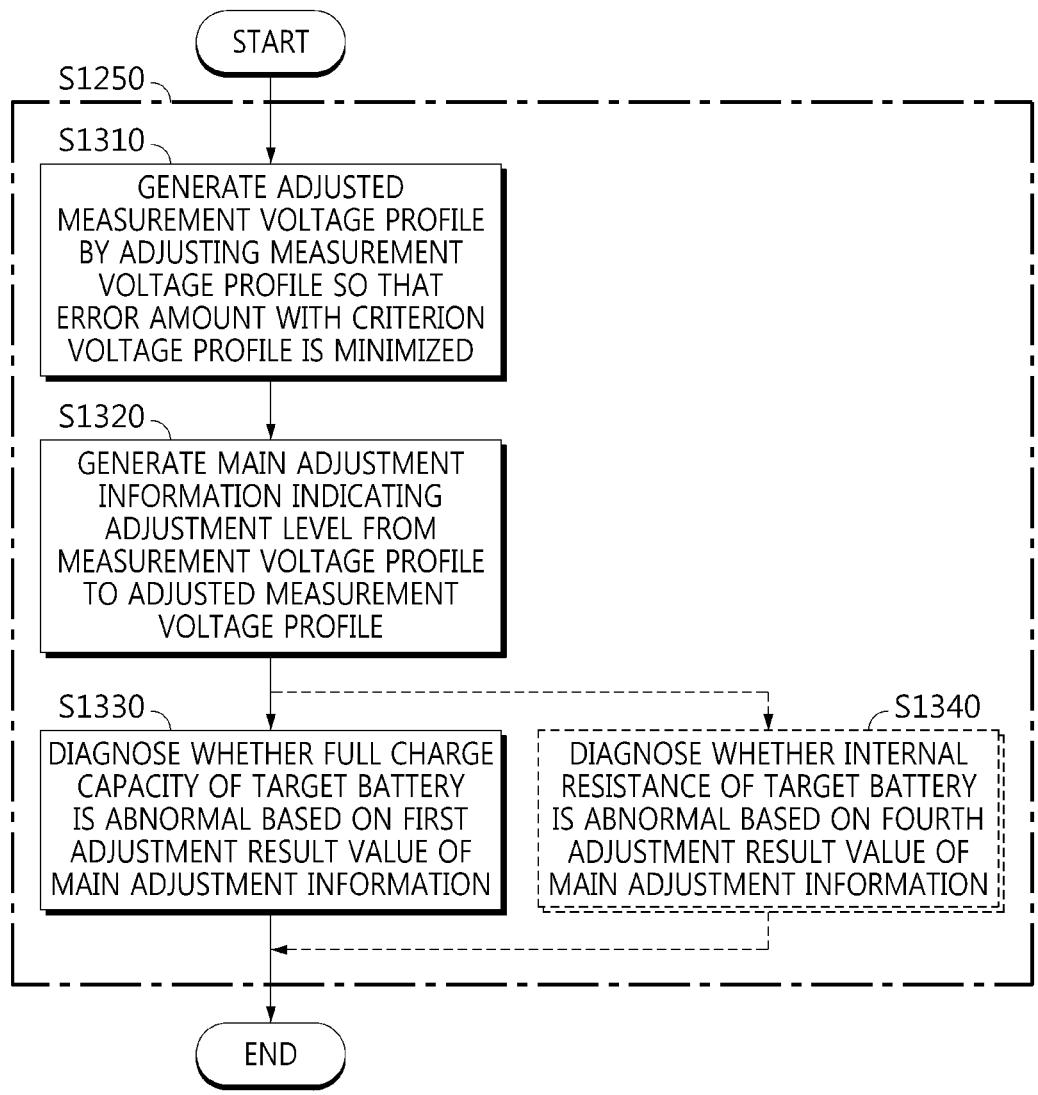
FIG. 13 is a flowchart showing an example of subroutines that can be included in step S1250 of FIG. 12.

FIG. 13 is a flowchart showing an example of subroutines that can be included in step S1250 of FIG. 12.

Referring to FIG. 13, step S1250 may include steps S1310 to S1330 as its subroutines.

In step S1310, the battery diagnosing unit 220 generates an adjusted measurement voltage profile (e.g., 901) by adjusting the measurement voltage profile 401 so that the error amount with the criterion voltage profile 400 is minimized.

In step S1320, the battery diagnosing unit 220 generates main adjustment information indicating the adjustment level from the measurement voltage profile 401 to the adjusted measurement voltage profile (e.g., 901). The main adjustment information includes at least the first and fourth adjustment result values among the first to fourth adjustment result values associated with the first to fourth adjustment logics.

In step S1330, the battery diagnosing unit 220 diagnoses whether the full charge capacity of the target battery B is abnormal based on the first adjustment result value of the main adjustment information.

Specifically, the battery diagnosing unit 220 may determine whether the full charge capacity of the target battery B is abnormal by comparing the first adjustment result value with the predetermined first diagnosis range.

The battery diagnosing unit 220 may determine the estimated full charge capacity (i.e., estimate of the full charge capacity) of the target battery B by applying the first adjustment result value of the main adjustment information to the criterion full charge capacity associated with the criterion voltage profile 400. As an example, if the criterion full charge capacity=108 Ah and the first adjustment result value=101%, the estimated full charge capacity of the target battery B=criterion full charge capacity/first adjustment result value*100%=106.93 Ah.

In step S1340, the battery diagnosing unit 220 diagnoses whether the internal resistance of the target battery B is abnormal based on the fourth adjustment result value of the main adjustment information.

Specifically, the battery diagnosing unit 220 may determine whether the internal resistance of the target battery B is abnormal by comparing the fourth adjustment result value with the predetermined second diagnosis range.

The battery diagnosing unit 220 may determine the estimated internal resistance (i.e., an estimate of the internal resistance) of the target battery B by applying the fourth adjustment result value of the main adjustment information to the criterion internal resistance associated with the criterion voltage profile 400. As an example, if the criterion internal resistance=20.0 mΩ, the fourth adjustment result value=0.4 mV, and the current rate=0.1 A, the estimated internal resistance of the target battery B=criterion internal resistance+fourth adjustment result value/current rate=20.04 mΩ. Step S1340 is an optional routine and can be omitted in the method of FIG. 13.

The embodiments of the present disclosure described above are not only implemented through devices and methods, but may also be implemented through a program that realizes the function corresponding to the configuration of the embodiment of the present disclosure or a recording medium on which the program is recorded, and this implementation can be easily made by any expert in the technical field to which the present disclosure belongs based on the above description of the embodiment.

Figure 14:
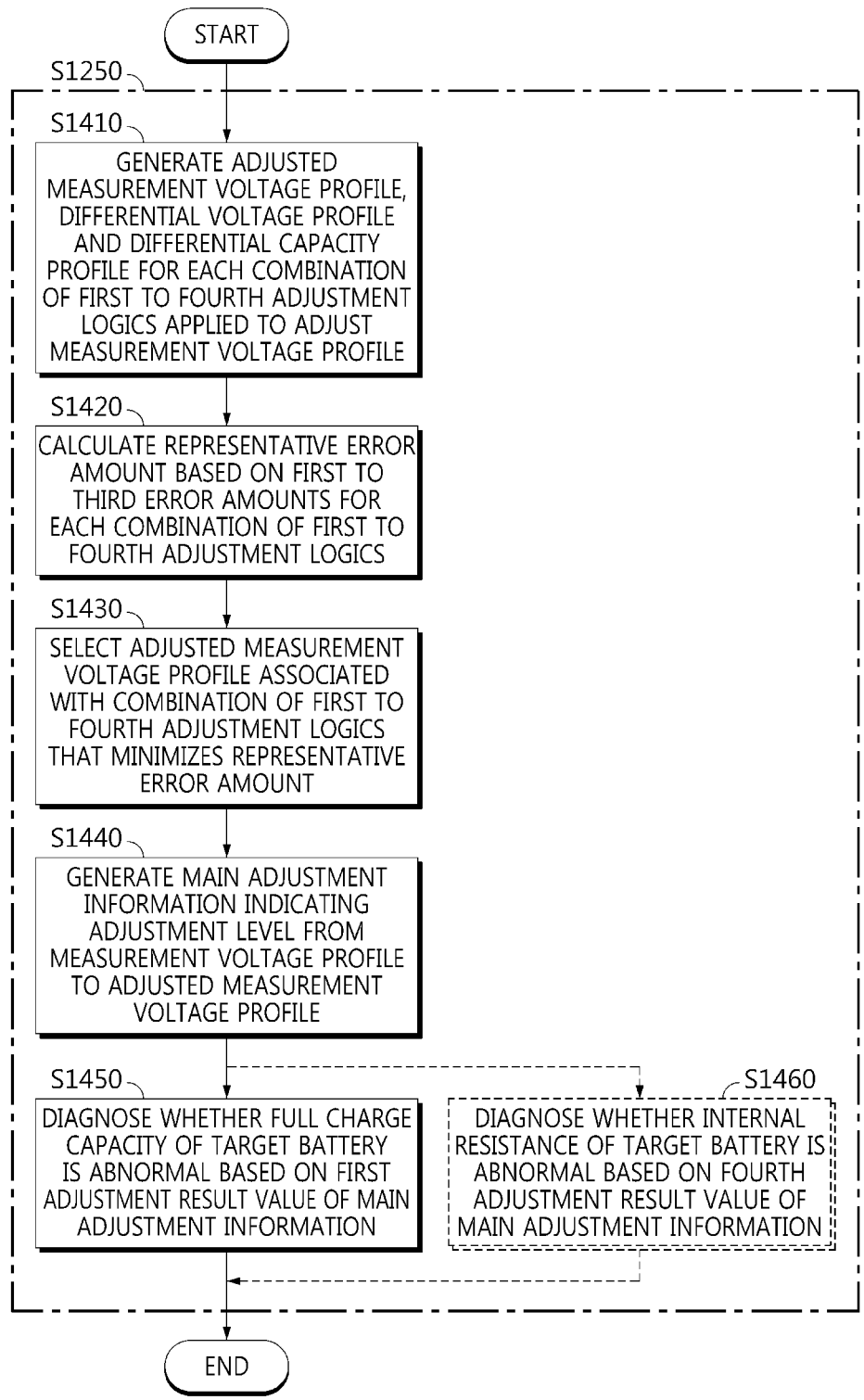
FIG. 14 is a flowchart showing another example of subroutines that can be included in step S1250 of FIG. 12.

FIG. 14 is a flowchart showing another example of subroutines that can be included in step S1250 of FIG. 12.

Referring to FIGS. 4 to 11 and FIG. 14, step S1250 may include steps S1410 to S1460 as its subroutines.

In step S1410, the battery diagnosing unit 220 generates an adjusted measurement voltage profile, a differential voltage profile, and a differential capacity profile for each combination of the first to fourth adjustment logics applied to adjust the measurement voltage profile 401.

In step S1420, the battery diagnosing unit 220 calculates a representative error amount based on the first to third error amounts for each combination of the first to fourth adjustment logics. For a specific combination of the first to fourth adjustment logics, the first error amount represents the error amount between the criterion voltage profile 400 and the adjusted measurement voltage profile (e.g., 901), the second error amount represents the error amount between the criterion differential voltage profile 1000 and the adjusted differential voltage profile (e.g., 1001), and the third error amount represents the error amount between the criterion differential capacity profile 1100 and the differential capacity profile (e.g., 1101), respectively. The representative error amount associated with a specific combination of the first to fourth adjustment logics may be the sum or average of the first to third error amounts associated with the same combination.

In step S1430, the battery diagnosing unit 220 selects the adjusted measurement voltage profile associated with the combination of the first to fourth adjustment logics that minimizes the representative error amount to diagnose abnormality of the target battery B.

In step S1440, the battery diagnosing unit 220 generates main adjustment information indicating the adjustment level from the measurement voltage profile 401 to the adjusted measurement voltage profile selected in step S1430. The main adjustment information includes at least the first and fourth adjustment result values among the first to fourth adjustment result values associated with the first to fourth adjustment logics.

In step S1450, the battery diagnosing unit 220 diagnoses whether the full charge capacity of the target battery B is abnormal based on the first adjustment result value of the main adjustment information. Step S1450 is substantially the same as step S1330.

In step S1460, the battery diagnosing unit 220 diagnoses whether the internal resistance of the target battery B is abnormal based on the fourth adjustment result value of the main adjustment information. Step S1460 is substantially the same as step S1340.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment May be selectively combined in part or in whole to allow various modifications.

What is claimed is:

1. A battery diagnosing apparatus, comprising:
 a battery sensing unit configured to generate a voltage detection signal indicating voltage of a target battery and a current detection signal indicating current of the target battery; and
 a battery diagnosing unit configured to generate a measurement voltage profile representing a correspondence between an accumulated capacity and the voltage of the target battery in a period of interest from a first time point when the voltage of the target battery reaches one of an upper limit and a lower limit of a predetermined voltage range of interest to a second time point when the voltage of the target battery reaches the other one of the upper limit and the lower limit of the voltage range of interest by monitoring the voltage and current of the target battery based on the voltage detection signal and the current detection signal collected from the battery sensing unit while the target battery is being charged or discharged,
 wherein the battery diagnosing unit is further configured to:
  diagnose abnormality of the target battery by comparing the measurement voltage profile with a criterion voltage profile,
  generate an adjusted measurement voltage profile by adjusting the measurement voltage profile so that an error amount with the criterion voltage profile is minimized,
  generate main adjustment information indicating an adjustment level from the measurement voltage profile to the adjusted measurement voltage profile, and
  determine an abnormality of at least one of a full charge capacity and an internal resistance of the target battery based on the main adjustment information, and
 wherein the criterion voltage profile represents a correspondence between the accumulated capacity and voltage of a criterion battery that is verified to be normal in an available voltage range wider than the voltage range of interest.

2. The battery diagnosing apparatus according to claim 1, wherein the battery diagnosing unit is further configured to determine an integration value of a current time series monitored over a period from the first time point to a specific time point within the period of interest as an accumulated capacity at the specific time point.

3. The battery diagnosing apparatus according to claim 1, wherein the battery sensing unit is further configured to generate a temperature detection signal indicating temperature of the target battery, and
 wherein the battery diagnosing unit is configured to select, as the criterion voltage profile, at least one of a plurality of comparison voltage profiles that are one-to-one associated with a plurality of criterion temperature values, based on the temperature detection signal generated over the period of interest.

4. The battery diagnosing apparatus according to claim 3, wherein the battery diagnosing unit is further configured to:
determine a representative temperature value in the period of interest based on the temperature detection signal, and
select a comparison voltage profile associated with any one of the plurality of criterion temperature values with a minimum temperature difference from the representative temperature value as the criterion voltage profile.

5. The battery diagnosing apparatus according to claim 3, wherein the battery diagnosing unit is further configured to:
determine a representative temperature value in the period of interest based on the temperature detection signal, and
select an average of two comparison voltage profiles associated with two criterion temperature values among the plurality of criterion temperature values as the criterion voltage profile, wherein the two criterion temperature values define a narrowest temperature range to which the representative temperature value belongs.

6. The battery diagnosing apparatus according to claim 1, wherein the battery diagnosing unit is further configured to determine a sum of squares or a root mean square error of a voltage difference between the adjusted measurement voltage profile and the criterion voltage profile in a common capacity range of the adjusted measurement voltage profile and the criterion voltage profile as the error amount between the adjusted measurement voltage profile and the criterion voltage profile.

7. The battery diagnosing apparatus according to claim 1, wherein the battery diagnosing unit is further configured to generate the adjusted measurement voltage profile by applying each of first to fourth adjustment logics to the measurement voltage profile,
wherein the first adjustment logic is a capacity scaling logic that reduces or expands the measurement voltage profile along a first axis corresponding to the accumulated capacity,
wherein the second adjustment logic is a capacity shifting logic that moves the measurement voltage profile in parallel along the first axis,
wherein the third adjustment logic is a voltage scaling logic that reduces or expands the measurement voltage profile along a second axis corresponding to the voltage,
wherein the fourth adjustment logic is a voltage shifting logic that moves the measurement voltage profile in parallel along the second axis, and
wherein the main adjustment information includes first to fourth adjustment result values that are one-to-one related to the first to fourth adjustment logics.

8. The battery diagnosing apparatus according to claim 7, wherein the battery diagnosing unit is further configured to determine abnormality of the full charge capacity of the target battery by comparing the first adjustment result value of the main adjustment information with a first diagnosis range.

9. The battery diagnosing apparatus according to claim 7, wherein the battery diagnosing unit is further configured to determine an estimated full charge capacity of the target battery by applying the first adjustment result value of the main adjustment information to a criterion full charge capacity associated with the criterion voltage profile.

10. The battery diagnosing apparatus according to claim 7, wherein the battery diagnosing unit is further configured to determine abnormality of the internal resistance of the target battery by comparing the fourth adjustment result value of the main adjustment information with a second diagnosis range.

11. The battery diagnosing apparatus according to claim 7, wherein the battery diagnosing unit is further configured to determine an estimated internal resistance of the target battery by applying the fourth adjustment result value of the main adjustment information to a criterion internal resistance associated with the criterion voltage profile.

12. A battery inspection system, comprising the battery diagnosing apparatus according to claim 1.

13. A battery diagnosing method, comprising:
collecting, while a target battery is being charged or discharged, a voltage detection signal indicating a voltage of the target battery and a current detection signal indicating a current of the target battery;
generating a measurement voltage profile representing a correspondence between an accumulated capacity and the voltage of the target battery in a period of interest from a first time point when the voltage of the target battery reaches one of an upper limit and a lower limit of a predetermined voltage range of interest to a second time point when the voltage of the target battery reaches the other one of the upper limit and the lower limit of the voltage range of interest by monitoring the voltage and current of the target battery based on the voltage detection signal and the current detection signal; and
diagnosing abnormality of the target battery by comparing the measurement voltage profile with a criterion voltage profile, wherein diagnosing the abnormality of the target battery further comprises:
generating an adjusted measurement voltage profile by adjusting the measurement voltage profile so that an error amount with the criterion voltage profile is minimized,
generating main adjustment information indicating an adjustment level from the measurement voltage profile to the adjusted measurement voltage profile, and
determining an abnormality of at least one of a full charge capacity and an internal resistance of the target battery based on the main adjustment information, and
wherein the criterion voltage profile represents a correspondence between the accumulated capacity and voltage of a criterion battery that is verified to be normal in an available voltage range wider than the voltage range of interest.

14. The battery diagnosing method according to claim 13, further comprising:
determining a sum of squares or a root mean square error of a voltage difference between the adjusted measurement voltage profile and the criterion voltage profile in a common capacity range of the adjusted measurement voltage profile and the criterion voltage profile as the error amount between the adjusted measurement voltage profile and the criterion voltage profile.

15. The battery diagnosing method according to claim 13, wherein generating the adjusted measurement voltage profile further comprises applying each of first to fourth adjustment logics to the measurement voltage profile, wherein the first adjustment logic is a capacity scaling logic that reduces or expands the measurement voltage profile along a first axis corresponding to the accumulated capacity, wherein the second adjustment logic is a capacity shifting logic that moves the measurement voltage profile in parallel along the first axis, wherein the third adjustment logic is a voltage scaling logic that reduces or expands the measurement voltage profile along a second axis corresponding to the voltage, wherein the fourth adjustment logic is a voltage shifting logic that moves the measurement voltage profile in parallel along the second axis, and wherein the main adjustment information includes first to fourth adjustment result values that are one-to-one related to the first to fourth adjustment logics.

16. The battery diagnosing method according to claim 15, wherein determining the abnormality of the full charge capacity of the target battery comprises comparing the first adjustment result value of the main adjustment information with a first diagnosis range.

17. The battery diagnosing method according to claim 15, further comprising determining an estimated full charge capacity of the target battery by applying the first adjustment result value of the main adjustment information to a criterion full charge capacity associated with the criterion voltage profile.

18. The battery diagnosing method according to claim 15, wherein determining the abnormality of the internal resistance of the target battery comprises comparing the fourth adjustment result value of the main adjustment information with a second diagnosis range.

* * * * *